US007573349B2

(12) United States Patent
Rauch

(10) Patent No.: US 7,573,349 B2
(45) Date of Patent: Aug. 11, 2009

(54) ANTENNA BALUN

(75) Inventor: Charles T. Rauch, Barnesville, GA (US)

(73) Assignee: PDS Electronics, Inc., Akron, OH (US)

( * ) Notice: Subject to any disclaimer, the term of this patent is extended or adjusted under 35 U.S.C. 154(b) by 400 days.

(21) Appl. No.: 11/523,141

(22) Filed: Sep. 19, 2006

(65) Prior Publication Data

US 2007/0063787 A1 Mar. 22, 2007

Related U.S. Application Data

(60) Provisional application No. 60/718,008, filed on Sep. 19, 2005.

(51) Int. Cl.
*H03H 7/42* (2006.01)
*H03H 7/38* (2006.01)

(52) U.S. Cl. .......................................... 333/26; 333/32

(58) Field of Classification Search .................. 333/26, 333/25, 132, 32
See application file for complete search history.

(56) References Cited

U.S. PATENT DOCUMENTS

| | | | | |
|---|---|---|---|---|
| 5,977,842 | A * | 11/1999 | Brown et al. | 333/26 |
| 6,130,588 | A * | 10/2000 | Gallivan et al. | 333/25 |
| 6,750,752 | B2 * | 6/2004 | Werlau | 336/229 |

* cited by examiner

*Primary Examiner*—Dean O Takaoka
(74) *Attorney, Agent, or Firm*—Renner, Kenner, Greive, Bobak, Taylor & Weber

(57) ABSTRACT

The present antenna system includes a balun for coupling an antenna to a feed line. The balun has at least two transmission line transformers, such that the transmission line transformers are coupled in parallel at their inputs with the feedline, and coupled in series at their outputs with the antenna. At least one of the transmission line transformers maintained by the balun is fabricated so that it has reduced power dissipation properties, and reduced electromagnetic stress handling properties with respect to the other transmission line transformers. Such considerations reduce fabrication time, waste of material, and the cost of the balun.

5 Claims, 1 Drawing Sheet

ANTENNA BALUN

CROSS-REFERENCE TO RELATED APPLICATION

This application claims the benefit of U.S. Provisional Application No. 60/718,008, filed Sep. 19, 2005. The specification of the above-referenced application is incorporated herein by reference.

TECHNICAL FIELD

The present invention relates to an antenna balun utilizing a pair of transmission line transformers. More specifically, the present invention is directed to a balun in which the power dissipation capacity of each of the transmission line transformers is unequal. More particularly, the present invention relates to a balun in which the electromagnetic handling capacity of each of the transmission line transformers is unequal.

BACKGROUND ART

Baluns are used to interface balanced systems to unbalanced systems, and to transition electrical energy therebetween. In fact, the word "balun" is derived from the "bal" of balanced and the "un" of unbalanced. Many antennas interface with an unbalanced feedline, such as a coaxial cable. A variety of antenna systems, such as a dipole antenna, are commonly regarded as balanced systems. However, in practice, such systems may exhibit some degree of voltage imbalance on the terminals of the antenna. As such, these antennas may be referred to as imperfectly balanced. As a result, when using a dipole antenna or other balanced antenna system, baluns are often added to transition balanced or imperfectly balanced terminal voltages of an antenna to unbalanced voltages of a feedline while maintaining equal and opposite currents at any instant of time in and out of the interface. The balun also transitions a balanced signal voltage transmitted or received by the antenna from or to the unbalanced voltage of a coaxial feed line.

Although some baluns transform impedances when transitioning between balanced to unbalanced systems, the main function of a balun is to provide proper isolation of current paths and voltage differences between balanced and unbalanced voltage systems. As one example, the need for a balun, and the isolation of paths provided by the balun, is seen when the balanced voltages of dipole antenna feedpoints are attached to unbalanced voltages of a coaxial feed line. While this example is of a dipole antenna, balanced and unbalanced also applies to other antenna systems and feedlines, which always must be someplace between being perfectly balanced and perfectly unbalanced in voltages while generally requiring exactly equal and opposing currents for optimum performance or satisfactory operation. In this example, a first dipole arm and a second dipole arm form a balanced or nearly balanced voltage load for the transmission line. The first dipole arm or balanced load terminal is attached directly to the inner conductor of the coaxial cable and the second dipole arm is attached directly to the outer conductor of the coaxial cable.

When any perfectly balanced voltage or imperfectly balanced voltage antenna system is operating without a balun and is connected to an unbalanced voltage transmission line, a first current flows in one direction at one instant of time through the first dipole arm and the inner conductor. At the same instant of time, a second current flows oppositely along the inside wall of the coaxial outer conductor and a portion reaches and flows into the second dipole arm. However, a third unwanted current develops where the second dipole arm is attached to the outer conductor of the unbalanced feedline. In this dipole example, an electrical voltage appears at the attachment point for the second current, and this voltage causes a third current and unwanted voltage to be created along the outer surface (or shield) of the coaxial cable. That is, the desired transmission line power is divided into two power components. The first power or energy component flows to or from the desired place known as the antenna, and a second unwanted power component appears from an undesired third current and voltage along the outside of the shield. As a result, the desired power is effectively divided into an unwanted and harmful power caused by unwanted current and voltage in an undesired place.

The creation of the third unwanted current results in unwanted and undesired radiation or reception from the feed line, and undesired unequal currents in the dipole arms. Such radiation and unequal currents consume power from the energy transferred between the antenna and the receiver, generator, or transmitter system, and, therefore, decrease efficiency and performance of the entire system. However, the magnitude of the disturbance in voltages and undesired third current depends on the impedance of the outside surface of the coaxial cable and the voltage driving that unwanted current. For example, if the impedance of the surface of the coaxial cable, antenna, other transmission line, or load is very high, then the amount of electrical current generated at the above-described transition point is low, and, therefore, the amount of useful and wanted electrical power converted into an undesired and harmful power is low. Consequently, when the impedance on the outside surface of a coaxial cable is high, the power is not divided, and the third unwanted current is effectively eliminated.

Therefore, if the impedance of the outside surface of the coaxial cable can be increased, then the radiation from the feed line and the unequal currents and voltages in the dipole arms due to the third current can be eliminated as a problem. To that end, the purpose of the balun is to increase the impedance along the outside surface of the transmission line, restricting unwanted diversion of useful power to useless or harmful power at the transition point.

Of particular concern is that impedance transforming baluns typically utilize two or more transmission line transformers that have equivalent construction and equivalent electromagnetic handling characteristics. However, during operation, the first transformer is required to dissipate only a fraction of the power that the remaining transformers are subjected to. As such, constructing each of the transmission line transformers to be equivalent is unnecessary, wastes material, and unnecessarily adds to the overall cost of producing the balun.

Thus, there is a need for a balun that includes one transmission line transformer that has a greater impedance than a remaining number of transmission line transformers. Additionally, there is a need for a balun that includes one transmission line transformer that is able to dissipate more power and withstand more electromagnetic induced stress than a remaining number of transmission line transformers. There is still yet a need for a transmission line transformer that uses a reduced amount core material than a remaining number of transmission line transformers.

DISCLOSURE OF THE INVENTION

It is thus an object of the present invention to provide a balun that utilizes one transmission line transformer that is constructed to dissipate more power than other transmission line transformers maintained by the balun.

It is another object of the present invention to provide a balun, as above, that utilizes one transmission line transformer that is constructed to withstand more electromagnetic induced stress than other transmission line transformers maintained by the balun.

It is still another object of the present invention to provide a balun, as above, that utilizes a transmission line transformer that is constructed to have less core material than the cores maintained by other transmission line transformers maintained by the balun.

It is yet another object of the present invention to provide a balun, as above, that utilizes a transmission line transformer that has an impedance that is greater than the impedance of other transmission line transformers maintained by the balun.

These and other objects of the present invention, as well as the advantages thereof over existing prior art forms, which will become apparent from the description to follow, are accomplished by the improvements hereinafter described and claimed.

In general, a balun for coupling an antenna to a coaxial feedline includes a first transmission line transformer having a core, and a second transmission line transformer having a core. Each of the first and second transmission line transformers have an input and an output. The first and second transmission line transformers are coupled in parallel at their inputs to the feedline, and coupled in series at their outputs to the antenna.

A preferred exemplary antenna balun incorporating the concepts of the present invention is shown by way of example in the accompanying drawings without attempting to show all the various forms and modifications in which the invention might be embodied, the invention being measured by the appended claims and not by the details of the specification.

PREFERRED EMBODIMENT FOR CARRYING OUT THE INVENTION

Figure 1:
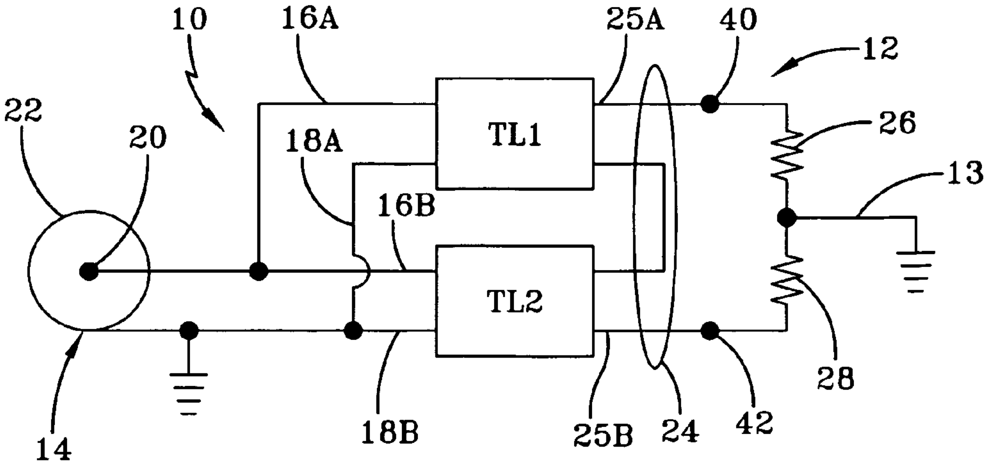
FIG. 1 is a schematic diagram of the balun with its output grounded at a point between each antenna resistance.
Figure 2:
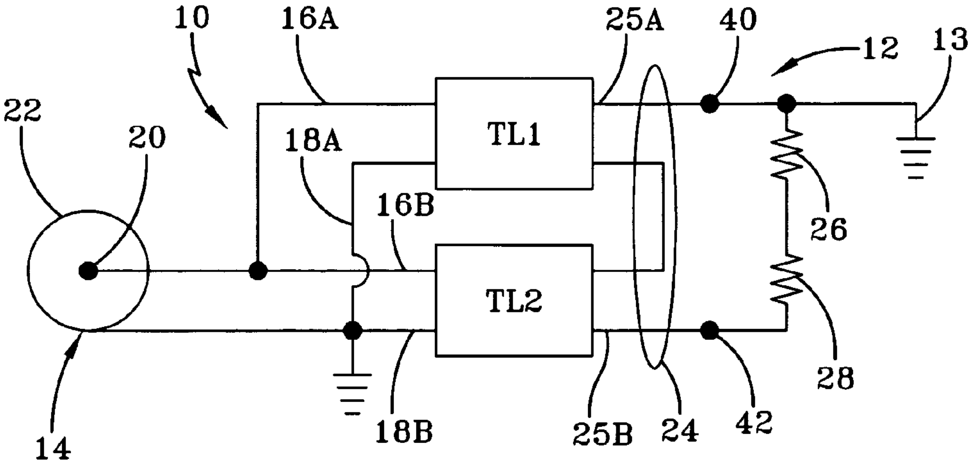
FIG. 2 is a schematic diagram of the balun with its output grounded at a point above both antenna resistances.
Figure 3:
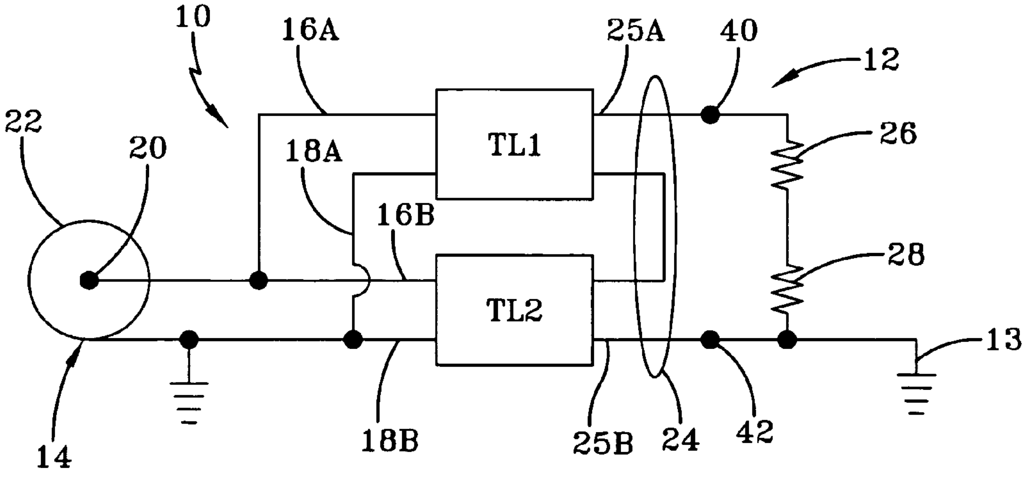
FIG. 3 is a schematic diagram of the balun with its output grounded at a point below both antenna resistances.

A typical balun is identified by the numeral 10, as shown in FIGS. 1-3, and is used to couple a balanced dipole antenna 12 with an unbalanced feedline 14. Balun 10 includes two transmission line transformers referred to as TL1 and TL2. Typically, transmission line transformer TL1 and TL2 are created to have the same structural and operational characteristics. Thus, they can be said to be equivalent. However, because of the typical arrangement of transmission line transformer TL1 and TL2 with respect to the feedline 14 and antenna 12, transmission line transformer TL1 is subjected only to a portion of the common mode voltage, magnetic flux intensity, and other electromagnetic stresses that transmission line transformer TL2 is subjected to.

FIGS. 1-3 illustrate the ideal, and worst case conditions under which the balun 10 may operate. In FIG. 1, a perfectly balanced antenna 12 is shown in which the 500V signal received by the antenna 12 is equally distributed with respect to a ground reference 13. It is also assumed for the purpose of this discussion that the resistance values of transmission line transformers TL1 and TL2 are equal to 1 K Ohm each. However, this value is selected to facilitate the following discussion, and should not be construed as limiting, as the TL1 and TL2 may be configured to have any desired resistance. As such, transmission line transformer TL1 has zero volts across its terminals, whereas transmission line transformer TL2 has 250V across its terminals. Resultantly, transmission line transformer TL1 dissipates zero watts, while transmission line transformer TL2 dissipates 62.5 watts.

Next, FIG. 2 shows a worst case in which the normally balanced antenna 12 exhibits characteristics of a perfectly unbalanced antenna. This unbalanced condition of the antenna 12 results in ground 13 being shifted to the output of transmission line transformer TL1, resulting in the 500V signal at the antenna 12 being coupled to the output of transmission line transformer TL2. As such, transmission line transformer TL1 has 250 V across its terminals, while transmission line transmission line transformer TL2 has 500V across its terminals. As a result, transmission line transformer TL1 dissipates 62.5 watts, whereas transmission line transformer TL2 dissipates 250 watts.

Finally, in another worst case shown in FIG. 3, the normally balanced antenna 12 again exhibits characteristics of a perfectly unbalanced antenna that is represented by ground 13 being shifted to the output of transmission line transformer TL2. This results in the 500V signal at the antenna 12 being coupled to the output of transmission line transformer TL1. As such, transmission line transformer TL1 has 250V across its terminals, while transmission line transformer TL2 has zero volts across its terminals. Thus, transmission line transformer TL1 dissipates 62.5 watts, whereas transmission line transformer TL2 dissipates 0 watts.

It should be appreciated, that while the above examples make reference to specific voltages and resistance values, other operating voltages may be utilized by the balun 10. Additionally, balun 10 is generally referred to as a 4 to 1 balun, due to is ability to match the 200 Ohm impedance of antenna 12 with the 50 ohm impedance load of coaxial feedline 12. However, it should be appreciated that balun 10 may be configured to provide impedance matching of differing output to input ratios if desired.

Thus, from the preceding examples, transmission line transformer TL1 dissipates maximum power when the balun 10 is used with an antenna 12 that is perfectly unbalanced, such that the ground is shifted to the output of the transformer TL1, as shown in FIG. 2. In addition, the maximum power required to be dissipated by transformer TL2 is based on the maximum power dissipated by transformer TL1. Specifically, transmission line transformer TL1 is required to dissipate at its maximum, an amount of power that is equal to one quarter of the power dissipated by transformer TL2, which occurs when the perfectly unbalanced antenna 12 of FIG. 2 is utilized with the balun 10. Thus, the maximum power dissipation of TL1 establishes an upper threshold or maximum amount of the power that TL1 is required to dissipate when the balun 10 is in use. However, transformer TL1 may dissipate more power, as discussed with regard to FIG. 3, or less power, as discussed with regard to FIGS. 1 and 2, than that dissipated by transformer TL2. But, the amount of power dissipated by transformer TL1 during its operation will never exceed one quarter of the maximum power dissipated by transmission line transformer TL2 when transformer TL2 is coupled to a perfectly imbalanced antenna with ground shifted to the output of transformer TL1, as shown in FIG. 2.

As such, it is unnecessary for transmission line transformers TL1 and TL2 to be constructed equivalently. Rather, by constructing transmission line transformer TL1 to have reduced power dissipating characteristics, while maintaining the ability of transmission line transformer TL2 to withstand the common mode voltage and the electromagnetic stresses that it is subjected to during the aforementioned worst cases, the material and costs required to produce balun 10 may be reduced.

As previously discussed, balun 10 shown in FIG. 1 is used to couple balanced antenna 12 with unbalanced feedline 14, and is composed of two transmission line transformers TL1 and TL2. While the present embodiment of balun 10 includes two transmission line transformers, it should be appreciated that balun 10 may be composed of two or more transmission line transformers if desired. Each transformer TL1 and TL2 is formed from a core of ferrite material about which a coaxial cable is wrapped in a toroid-like configuration. Alternatively, the core may be configured from a coaxial cable wrapped around an air core. Ferrite beads may also be used to enhance performance of the cores as well. Additionally, each transformer TL1 and TL2 has two inputs 16A-B and 18A-B allowing transformers TL1 and TL2 to be coupled together in a parallel configuration at their inputs. Inputs 16A-B are coupled to a center conductor 20 of a coaxial feedline 14, while inputs 18A-B are coupled to a grounded shielding portion 22 of feedline 14. The output 24 of transformers TL1 and TL2 are coupled to antenna 12 in a series connection via output lines 25A and 25B. Antenna 12 is represented by two series resistances 26, 28 of 100 ohms each that are separated from each other by ground 13. Nodes 40, 42 separate resistances 26, 28 from each respective transmission line transformer TL1, TL2.

Because transmission line transformers TL1 and TL2 do not need to have equivalent power dissipation properties and electromagnetic handling properties, transformer TL1 may be configured to have reduced electrical and magnetic stress handling characteristics. Specifically, transformer TL1 may be configured to withstand less common mode voltage, and less heat due to the various magnetic fields present, magnetic field intensity, and magnetic flux for example. Various techniques are known to accomplish this end, as discussed in detail below. The reduction in power dissipation, and electrical handling ability, allows the ferrite core of transmission line transformer TL1 to be fabricated using less material from that of transformer TL2. In addition to using less material, the ferrite core of transmission line transformer TL1 may be made with different materials from that of transmission line transformer TL2. Additionally, the ferrite core of transmission transformer TL1 may be configured to be half of the physical size of the ferrite core of transmission transformer TL2. By utilizing one or more of these design considerations, transmission line transformer TL1 can be made to dissipate less power, handle less common mode voltage, and withstand less electromagnetic stress than transmission line transformer TL2. For example, transformer TL1 may be constructed to dissipate in a worst case a maximum of 62.5 watts.

Correspondingly, for transmission line transformer TL2 to withstand a higher common mode voltage at its terminals than transformer TL1, transformer TL2 is configured to have a higher impedance than that of transformer TL1. In addition, to allow transformer TL2 to withstand the heat and stress generated due to the electric and magnetic fields created within transformer TL2, the transformer TL2 may be suitably configured to have the appropriate physical attributes to handle such operating conditions. One method to create a suitable transformer TL2 involves fabricating the core of transformer TL2 with more core material than the core of transformer TL1. In addition, the core of transformers TL1 and TL2 may be made from dissimilar materials altogether. It is also contemplated that the core of transformer TL2 may be made physically larger than that of transformer TL1. For example, transformer TL2 may be constructed to dissipate in a worst case 250 watts.

By utilizing these design considerations, transmission line transformer TL1 and transmission line TL2 can be configured so that they do not have any unnecessary electromagnetic handling capacity. That is, the design considerations discussed allow each transformer TL1 and TL2 to be constructed to accommodate only the maximum amount of electrical and magnetic stress that each transformer TL1, TL2 is individually subjected to. As such, waste, or electrical/magnetic overcapacity due to making both transformers TL1 and TL2 equivalent is avoided, and the cost of fabricating balun 10 is thereby reduced.

It will, therefore, be appreciated that one advantage of one or more embodiments of the present invention is that the amount of material required to manufacture the balun is reduced, thereby reducing cost. Yet another advantage of the present invention is that the balun may use dissimilar transmission line transformer cores. Still another advantage of the present invention is that the transmission line transformer cores may be configured to sustain large amounts of electromagnetic induced stress and heat.

What is claimed is:

1. A balun for coupling an antenna having a ground connection to a coaxial feedline having a ground connection, the balun comprising only two transmission line transformers, a said first transmission line transformer having a core , said first transmission line transformer having a pair of inputs and a pair of associated outputs;

a said second transmission line transformer having a core, said second transmission line transformer having a pair of inputs and a pair of associated outputs, said core of said second transmission line transformer being larger than said core of said first transmission line transformer;

wherein said first and second transmission line transformers are coupled in parallel at their inputs to the feedline, and coupled in series at their outputs to the antenna, such that one said input of said second transmission line transformer is coupled to the ground of the coaxial feedline, and said output which is associated with said one of said input is coupled to the ground connection of the antenna, such that said core of said second transmission line transformer dissipates more power than said core of said first transmission line transformer.

2. The balun according to claim 1, wherein said second transmission line transformer has a higher impedance than that of said first transmission line transformer.

3. The balun according to claim 1, wherein said cores of said first and second transmission line transformers are made from different material.

4. The balun according to claim 1, wherein at least one of said first and second transmission line transformers are made of ferrite.

5. The balun according to claim 1, wherein said core of said second transmission line transformer is comprised of more core material than said core of said first transmission line transformer.

* * * * *